(12) United States Patent
Melanson et al.

(10) Patent No.: US 7,746,972 B1
(45) Date of Patent: Jun. 29, 2010

(54) NUMERICALLY-CONTROLLED PHASE-LOCK LOOP WITH INPUT TIMING REFERENCE-DEPENDENT RATIO ADJUSTMENT

(75) Inventors: John L. Melanson, Austin, TX (US); Zhong You, Austin, TX (US); Scott Allan Woodford, Austin, TX (US); Steven Randall Green, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 602 days.

(21) Appl. No.: 11/689,729

(22) Filed: Mar. 22, 2007

(51) Int. Cl.
*H03D 3/24* (2006.01)
(52) U.S. Cl. .................. 375/376; 375/354; 375/371; 375/375; 455/260; 455/516; 327/141; 327/147; 327/156
(58) Field of Classification Search ............... 375/354, 375/376, 371, 375; 327/141, 147, 156; 455/260, 455/516
See application file for complete search history.

(56) References Cited

U.S. PATENT DOCUMENTS

| 5,786,778 | A | 7/1998 | Adams et al. |
| 5,828,678 | A * | 10/1998 | Mock .................. 714/815 |
| 6,424,185 | B1 * | 7/2002 | Wolf .................. 327/107 |
| 7,049,852 | B2 | 5/2006 | Melanson |
| 7,092,476 | B1 | 8/2006 | Melanson |
| 2003/0021370 | A1 * | 1/2003 | Menkhoff ............ 375/355 |
| 2007/0001722 | A1 * | 1/2007 | Young et al. ......... 327/156 |

FOREIGN PATENT DOCUMENTS

WO WO9933182 A2 7/1999
WO WO2004088845 A1 10/2004

OTHER PUBLICATIONS

U.S. Appl. No. 11/232,650, filed Sep. 22, 2005, Melanson.
U.S. Appl. No. 11/082,347, filed Mar. 17, 2005, Jiang, et al.
U.S. Appl. No. 11/088,446, filed Mar. 24, 2005, Gudmunson, et al.
U.S. Appl. No. 11/082,346, filed Mar. 17, 2005, Gudmunson, et al.
U.S. Appl. No. 11/618,784, filed Dec. 30, 2006, Melanson, et al.

* cited by examiner

*Primary Examiner*—David C Payne
*Assistant Examiner*—Leon Flores
(74) *Attorney, Agent, or Firm*—Andrew M. Harris; Mitch Harris, Atty at Law, LLC (57) ABSTRACT

A numerically-controlled phase-lock loop with input clock dependent ratio adjustment provides for narrower-bandwidth loops that lock to a wide range of frequencies and/or operation with an absent or degraded input timing reference. A timing reference characteristic detector determines an input frequency range of the input timing reference signal, the data type of the timing reference, and/or whether a timing reference signal of sufficient quality is present. A numerically controlled oscillator is controlled by a numeric ratio that is adjusted to provide the desired clock frequency output in conformity with the detected frequency range and/or data type. If the timing reference signal is absent or degraded, then the numeric ratio can be set to a fixed value or a local timing reference can be applied in order to generate the desired clock output frequency.

22 Claims, 5 Drawing Sheets

Fig. 5

NUMERICALLY-CONTROLLED PHASE-LOCK LOOP WITH INPUT TIMING REFERENCE-DEPENDENT RATIO ADJUSTMENT

CROSS-REFERENCE TO RELATED APPLICATIONS

This application is related to U.S. patent application Ser. Nos. 11/614,368, filed on Dec. 21, 2006 entitled "HYBRID ANALOG/DIGITAL PHASE-LOCK LOOP FOR LOW-JITTER SYNCHRONIZATION" and 11/618,784, filed on Dec. 30, 2006 entitled "DIRECT DIGITAL SYNTHESIS (DDS) HYBRID PHASE-LOCK LOOP FOR LOW-JITTER SYNCHRONIZATION", both having at least on common inventor and assigned to the same Assignee. The above-referenced U.S. Patent Applications are incorporated herein by reference.

BACKGROUND OF THE INVENTION

1. Field of the Invention

The present invention relates generally to phase-lock loop (PLL) clock generation circuits, and more specifically, to a numerically-controlled PLL for providing a clock signal synchronized to an input timing reference signal.

2. Background of the Invention

Digital audio systems are prevalent in the areas of home entertainment, professional production of multimedia and computer reproduction and generation of multimedia sources. Increasingly, digital audio data is transported from sub-system to sub-system and device to device in both consumer and professional installations, and the data is generally provided with, or has embedded, a timing reference that has too much jitter to act as a stable sample clock reference. Furthermore, the timing information may be provided at a frequency that is lower than the clock rate needed to operate a digital audio sink, such as a digital-to-analog converter (DAC) that receives the incoming digital audio data stream.

Therefore, clock generation circuits that provide stable clock references synchronized to a digital audio stream's timing information are frequently required. The clock generating circuits must generally provide a low-jitter clock from a timing reference that may have a large amount of jitter present and/or from an additional interface clock that also may have a large amount of jitter. Further, such circuits in A/V applications must handle a wide range of potential input frequencies. The clock generation is typically provided by a phase-lock loop (PLL) and the loop bandwidth of the PLL is dictated in part by the frequency range over which the PLL must acquire (capture) and lock in a stable manner. However, wider-bandwidth PLLs have higher noise figures. Further, an input signal is not always available, or may be of degraded or varying quality such that operation of the PLL in synchronization with a clock input signal is not practical or possible.

Therefore, it would be desirable to provide a PLL synchronization circuit and method that provides for narrower bandwidth operation, while able to lock to a wide range of input signal frequencies. It would further be desirable to provide such a PLL that can operate without an input clock signal of sufficient quality for synchronized PLL operation.

SUMMARY OF THE INVENTION

The above stated objectives are achieved in fractional-N phase-lock loop (PLL) circuits and their method of operation. The PLL circuit includes a numerically-controlled oscillator that provides a clock output and has an input for receiving a rational number. The rational number represents a ratio between the frequency of the clock output and the frequency of another stable clock provided to the circuit.

A timing reference characteristic detection circuit determines whether or not a timing reference is present at a timing reference and/or determines a frequency range, data type and/or signal quality of the timing reference. The ratio used to control the numerically-controlled oscillator can be adjusted in conformity with determination of frequency range or data type of the timing reference. If the timing reference is absent or degraded, alternate internal timing reference is selectively applied as the timing reference. The alternate internal timing reference may be derived from the stable clock or may be independently generated.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses phase-lock loop (PLL) circuits and methods of operation for generating a clock output from a timing reference. The clock output is generated by a numerically controlled oscillator (NCO) circuit that is controlled by a numeric ratio input. A timing reference signal is phase/frequency compared with the clock output and the numeric ratio is adjusted so that the clock output has a desired phase/frequency relationship with the timing reference signal. A timing reference characteristic detector detects the presence, frequency range, data type, and/or signal quality, and the ratio is adjusted in conformity with the detected signal characteristic(s) in order to provide the desired operation. The ratio is adjusted in conformity with an output of the detected characteristic to provide the desired clock output frequency based on the frequency of the local timing reference. If the timing reference signal is absent or degraded, the NCO can be operated with a fixed ratio corresponding to the desired clock output frequency, or an alternate local timing reference may be applied to the phase/frequency detector.

Figure 1:
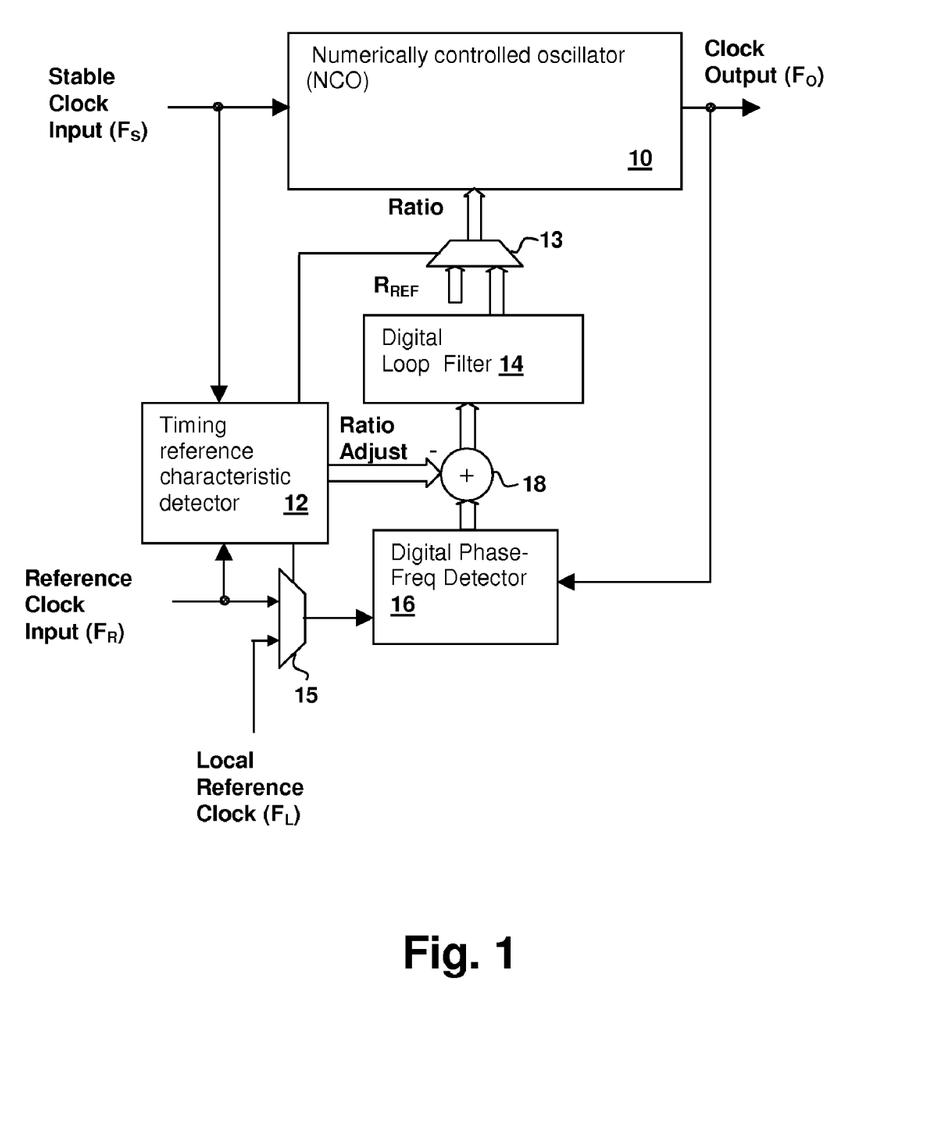
FIG. 1 is a block diagram depicting a PLL circuit in accordance with an embodiment of the present invention.

Referring now to FIG. 1, an exemplary PLL circuit in accordance with an embodiment of the invention is shown. The depicted circuit generates a low-jitter Clock Output signal that is synchronized to a Reference Clock signal. The Clock Output signal is generated by a numerically controlled oscillator 10 in response to a control number Ratio, which represents a rational relationship between the frequency ($F_o$) of the Clock Output signal and that of a Stable Clock signal ($F_s$), which is provided to numerically controlled oscillator (NCO) 10 as a reference clock. The control number Ratio is updated from an output of a digital loop filter 14 that filters the output of a digital phase-frequency detector 16. Digital phase-frequency detector 16 compares the frequency and phase of the Clock Output signal with a timing reference selected by a selector 15, which generally applies the Reference Clock signal to the input of digital phase-frequency detector 16, but depending on the suitability and presence of the Reference Clock signal, selector 15 may alternatively select a Local Reference Clock signal, which is generally an oscillator within the circuit as opposed to an externally supplied reference, to provide the timing reference. Another selector 13 may be activated if the Reference Clock signal is absent or unsuitable, and selects a ratio $R_{REF}$ to provide a fixed frequency output from NCO 10.

A timing reference characteristic detector 12 detects one or more characteristics of the Reference Clock signal, including detecting absence of the Reference Clock signal, such as occurs when an external audio/video synchronization or data signal is not supplied to the Reference Clock Input. Timing reference characteristic detector 12 also detects the frequency range of the signal supplied to the Reference Clock Input. The detected frequency range is then used to adjust the ratio controlling NCO 10, so that the loop bandwidth of the PLL circuit can be minimized, while handling a wide range of input frequencies. Additional benefits include a reduction of the required numeric range of digital loop filter 14, reduction of the required dynamic range in digital phase/frequency detector 16 and reduced disruption of PLL operation when changes in frequency of the Reference Clock Input signal occur. In particular, when the possible frequencies of the Reference Clock Input signal are related as integer multiples and the Ratio Adjust number is provided accordingly, loop disruption on changes of Reference Clock Input signal frequency is minimized. Also, the output of digital phase/frequency detector 16 need only provide a fine adjustment to the resulting number Ratio when the Ratio Adjust number provides the most-significant portion of the number Ratio.

The following table, Table I gives exemplary timing reference signal types that may be supplied to the circuit of FIG. 1 as the Reference Clock Input signal, along with resultant Ratio numbers for generating a sample rate*128 clock as the Clock Output signal frequency ($F_o$) from a 20 Mhz stable clock frequency ($F_s$). The above frequency combination requires a Ratio number of 0.3072, and the following table shows the raw ratio output of the phase-frequency detector and an exemplary Ratio Adjust number to achieve a Ratio number between 0 and 100 for each of the exemplary timing references, as well as possible selection criteria as used by timing reference characteristic detector 12 to determine which Ratio Adjust number to apply.

TABLE I

| Timing Reference Signal Type/ Sample Rate | Frequency | Raw Ratio | Ratio Adjust (−) | Selection Criteria |
|---|---|---|---|---|
| video vertical Sync/48 ksps | 59.94 Hz | 102502.5 | 102450 | Type + Freq Range |
| square wave vertical sync/48 ksps | 60 Hz | 102400 | 102350 | Type + Freq Range |
| SPDIF | 44100 Hz | 128 | 100 | Type |
| SPDIF | 48000 Hz | 128 | 100 | Type |

TABLE I-continued

| Timing Reference Signal Type/ Sample Rate | Frequency | Raw Ratio | Ratio Adjust (−) | Selection Criteria |
|---|---|---|---|---|
| USB/48 ksps | 1000 Hz | 6144 | 6100 | Type |
| IEEE1394/ 48 ksps | 8000 Hz | 768 | 700 | Type |
| Ethernet/ 48 ksps | 25 MHz | 0.24576 | 0 | Freq Range |
| Internal/ 48 ksps | 20 Mhz | 1 | 0 | Clock Absent |

Figure 2:
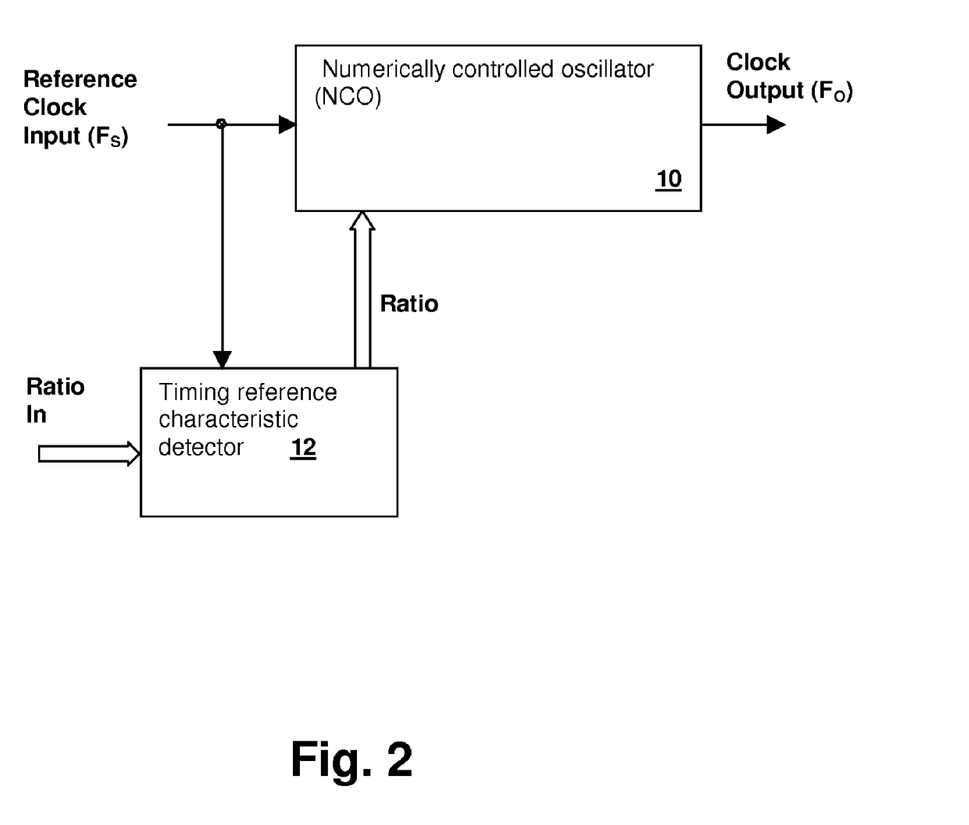
FIG. 2 is a block diagram depicting a PLL circuit in accordance with another embodiment of the present invention.

Referring now to FIG. 2, an exemplary PLL circuit in accordance with another embodiment of the invention is shown. The operation and structure of the PLL circuit of FIG. 2 is similar to that of FIG. 1 and therefore only differences between them will be described in further detail below. In the depicted embodiment, the timing reference is provided by a Reference Clock Input signal having frequency $F_s$ (instead of the Stable Clock Input of FIG. 1), and NCO 10 generates a Clock Output signal in accordance with a specified number Ratio. A number Ratio In is provided to timing reference characteristic detector 12 and is adjusted to provide the number Ratio in conformity with a frequency measurement or frequency range determination of the Reference Clock Input signal frequency F. Thus, the depicted PLL circuit is capable of self-adjusting to reference clocks that are supplied from an external source, and in which the supplied Reference Clock Input signal frequency $F_s$ may differ from application to application. The frequency range determination may be made by comparison with another internal clock otherwise unrelated to operation of the PLL, via a counter or other means. Alternatively, analog circuits such as one-shots or filters may be employed to determine a frequency range of the Reference Clock Input signal in order to decide a suitable adjustment to the number Ratio to provide the desired Clock Output signal frequency $F_o$, no matter the frequency $F_s$ of the supplied Reference Clock Input signal.

Figure 3:
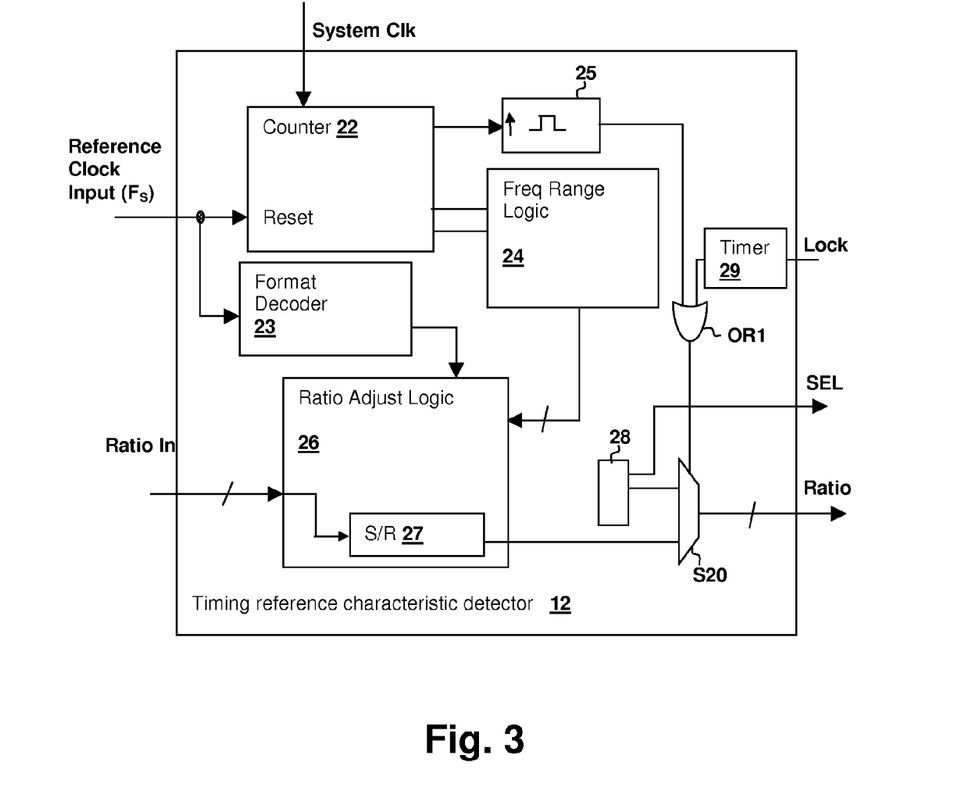
FIG. 3 is a block diagram depicting details of timing reference characteristic detector circuit 12 of FIG. 1 and FIG. 2.

Referring now to FIG. 3, details of timing reference characteristic detector 12 are shown, in accordance with an embodiment of the invention. A counter 22 is clocked by a System Clk clock signal, which may be the Stable Clock signal or another available clock signal. Counter 22 operates as a frequency counter, providing one or more bit outputs to a frequency range logic 24 that provide inputs to a ratio adjust logic block 26. Depending on the frequency range of the signal applied to the Reference Clock Input, ratio adjust logic 26 alters the number Ratio In to provide output number Ratio, by shifting the Ratio In number in a shift register 27, by combinatorial logic or other logic operations. A format decoder 23 is used to determine a data or signal type of a signal applied to the Reference Clock Input, and provides an output to ratio adjust logic 26 to further direct ratio adjust logic 26 to adjust ratio Ratio In. For example, if desired Clock Output frequency $F_o$ is a PCM bit rate (data length×word clock rate) and if the Reference Clock Input receives a word clock, the average Ratio value should be data length×$F_o$/$F_s$. However, if the Reference Clock Input receives a LR clock (left/right clock) for a stereo signal, then the Ratio value should be adjusted to an average value of 2×data length×$F_o$/$F_s$, to compensate for the 2:1 frequency relationship between the word clock and the LR clock.

A clock presence detector is provided by a retriggerable one-shot 25, which may be an analog circuit, or may be a digital circuit clocked by the System Clk signal or other clock signal. The output of retriggerable one-shot 25 is optionally combined with the output of a timer 29 that measures when a Lock input signal provided by the output of digital loop filter 14 of FIGS. 1 and 2 has remained de-asserted for a predetermined period of time. The Lock input signal can be used to indicate that the Reference Clock Input signal is degraded. The output of logical OR-gate OR1 combines the output of timer 29 with the output of retriggerable one-shot 25 to provide a control signal that operates a selector 20 that selects between the output of ratio adjust logic 26 and the output of a register 28 that holds a fixed ratio value. Register 28 can also provide a select signal SEL for fractional-N PLL implementations, for disabling the delta-sigma modulator when the Ratio number represents an integer ratio and when numerically-controlled oscillator 10 is a fractional-N oscillator.

Figure 4:
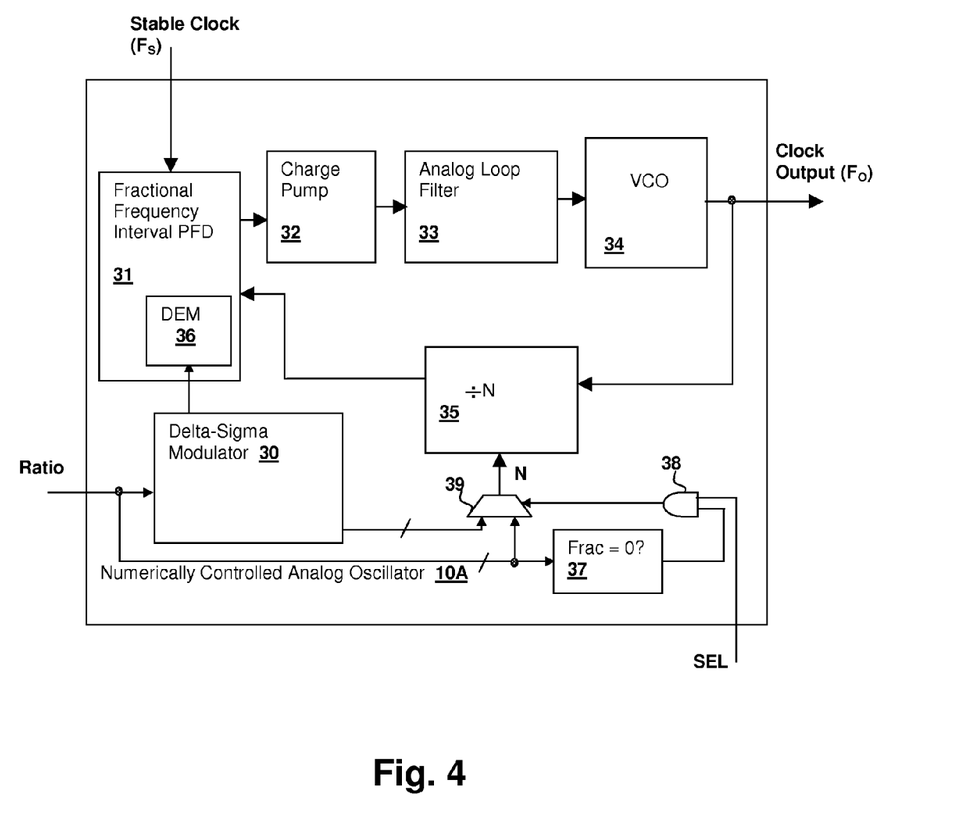
FIG. 4 is a block diagram depicting details of a fractional-N oscillator circuit 10A that may be used to implement numerically controlled oscillator 10 in the circuits of FIG. 1 and FIG. 2.

Referring now to FIG. 4, an exemplary NCO circuit 10A that can be utilized to implement NCO 10 in the circuits of FIG. 1 and FIG. 2 is shown. The depicted "fractional-N" oscillator circuit is disclosed in detail in U.S. Pat. No. 7,049,852, entitled "FRACTIONAL-INTEGER PHASE-LOCKED LOOP SYSTEM WITH A FRACTIONAL-FREQUENCY-INTERVAL PHASE FREQUENCY DETECTOR", issued to John L. Melanson on May 23, 2006, which is incorporated herein by reference. Furthermore, FIG. 1 of the above-incorporated U.S. Patent discloses another numerically-controlled analog oscillator that may be alternatively used to implement NCO 10 in the circuits of FIG. 1 and FIG. 2 if the wider-bandwidth and otherwise higher performance of the circuit depicted in FIG. 4 is not required for a given application. The circuit of FIG. 4 provides a low-jitter Clock Output signal that is determined by an input Ratio number and the frequency of the Stable Clock signal.

The Clock Output signal is provided from a voltage-controlled analog oscillator (VCO) 34 that receives a frequency control voltage from an analog loop filter 33. A fractional frequency interval phase-frequency detector (PFD) 31 provides a correction signal to charge pump 32, which is then filtered by analog loop filter 33 to generate the frequency control voltage. Fractional frequency interval PFD 31 compares the frequency and phase of the Stable Clock signal to the output of a divider 35 that divides the Clock Output signal by an integer value N. A delta-sigma modulator 30 varies integer value N according to the Ratio value and the noise shaping transfer function of delta-sigma modulator 30 so that the average frequency at the output of divider 35 is equal to the frequency $F_s$ of the Stable Clock signal. A control signal SEL may be provided to NCO 10 when a fixed number Ratio is being applied to the NCO 10, for example, when the timing reference signal is absent. When the SEL signal indicates that a fixed ratio $R_{FIXED}$ is being provided as the Ratio value, and the Ratio value has no fractional part as determined by comparison logic 37, then logical AND gate 38 selects the Ratio value via multiplexer 39 as the division factor of divider 35, rather than the output of delta-sigma modulator 30, to reduce tracking error and noise. A dynamic element matching block (DEM) 36 in fractional frequency interval PFD 31 receives the modulator feedback signal from delta-sigma modulator 30. The DEM 36 provides for matching of individual elements in fractional frequency interval PFD 31, which actually comprises multiple parallel phase-frequency detectors having inputs provided from a selection between the output of divider 35 and a delayed version of the output of divider 35, as described in further detail in the above-incorporated U.S. Patent.

Figure 5:
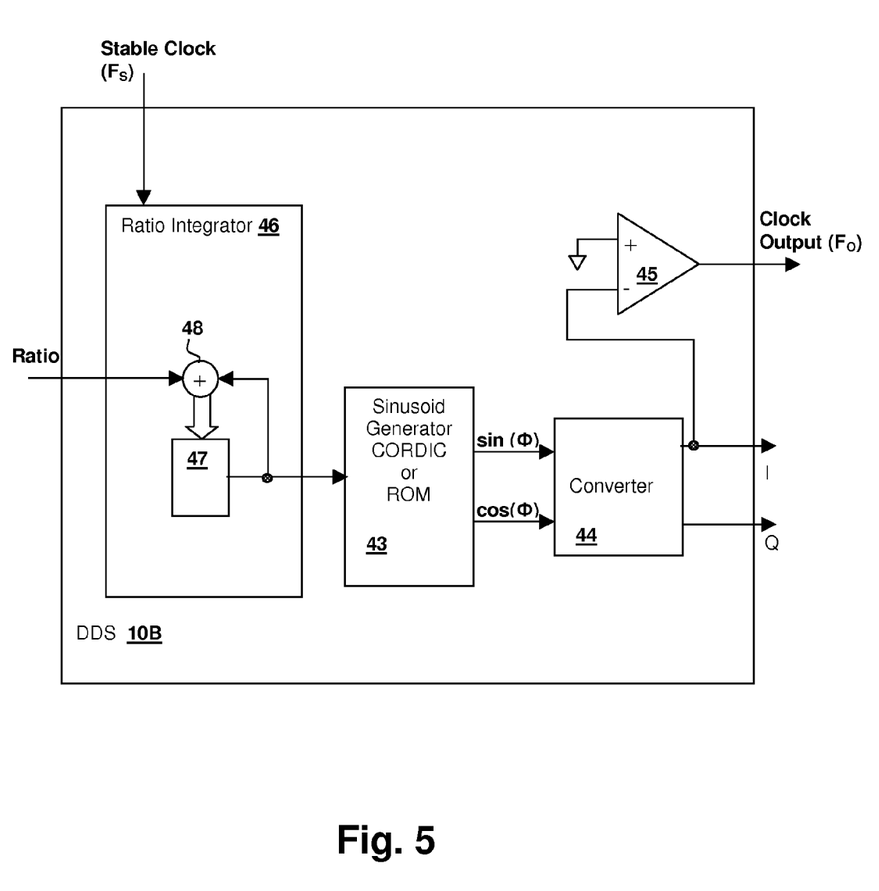
FIG. 5 is a block diagram depicting details of a direct digital synthesis (DDS) circuit 10B that may be used to implement numerically controlled oscillator 10 in the circuits of FIG. 1 and FIG. 2.

Referring now to FIG. 5, an alternative exemplary direct digital synthesis (DDS) circuit 10B that can be used to implement NCO 10 in the circuits of FIG. 1 and FIG. 2 is shown. The circuit of FIG. 5 provides a low-jitter Clock Output signal that has a frequency determined by an input Ratio number and the frequency of the Stable Clock signal. A ratio integrator 46 formed by a latch 47 and adder 48 integrates the Ratio number to provide an on-going phase number that is used by sinusoid generating circuit 43 to provide values corresponding to sinusoidal waveshapes ($e^{j\Phi}$), so that as the output phase $\Phi$ from ratio integrator 46 progresses, values corresponding to $\sin(\Phi)$ and $\cos(\Phi)$ are provided from sinusoid generating circuit 43 to a converter circuit 44 that provides sinusoidal analog signals I and Q at frequency $F_o$. As mentioned above, the and Q signals may be further frequency-multiplied by a complex PLL to obtain a higher frequency output clock and/or converted to digital form via a comparator 45 or other suitable analog-to-digital converter to provide a digital Clock Output signal. Sinusoid generating circuit 43 either calculates sinusoidal representation values via a CORDIC algorithm or indexes a read-only memory (ROM) using the input phase information. Use of a CORDIC algorithm processing block provides a compact implementation, as the ROM size required for look-up table implementation increases exponentially with an increase in the resolution of the phase value used as a look-up address.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit for providing a clock output synchronized to a timing reference signal supplied to a timing reference input, said circuit comprising:
   a numerically-controlled oscillator for providing said clock output and having an input for receiving a rational numeric representation of a ratio between a frequency of said clock output and a frequency of a stable clock for controlling said frequency of said clock output;
   a digital phase-frequency detector for generating a representation of an on-going phase-frequency difference between said timing reference signal and a signal derived from said clock output;
   a digital loop filter for filtering said representation of said on-going phase-frequency difference to provide said rational numeric representation to said numerically-controlled oscillator;
   a timing reference characteristic detection circuit for detecting a characteristic of the timing reference signal independent of the on-going phase-frequency difference; and
   a ratio adjustment circuit for adjusting said rational numeric representation resulting from the filtered representation of the on-going phase-frequency difference in conformity with said detected characteristic.

2. The circuit of claim 1, wherein said timing reference characteristic detector detects a frequency range of said timing reference signal, and wherein said ratio adjustment circuit adjusts said rational numeric representation in conformity with said detected frequency range.

3. The circuit of claim 2, wherein said timing reference signal has a frequency supplied from among a set of frequencies related by factors of two, and wherein said ratio adjustment circuit adjusts said rational numeric representation by shifting bits of said rational numeric representation according to a particular one of said factors of two determined in conformity with an output of said timing reference characteristic detector.

4. The circuit of claim 1, wherein said timing reference characteristic detector detects absence of said timing reference signal, and wherein said ratio adjustment circuit selects a fixed ratio as said rational numeric representation in response to said detected absence.

5. The circuit of claim 1, wherein said timing reference characteristic detector detects an absence of said timing reference signal and selects a local reference clock in place of said timing reference signal as an input to said phase/frequency detector and wherein said ratio adjustment circuit adjusts said rational numeric representation in conformity with a predetermined frequency of said local reference clock.

6. The circuit of claim 1, wherein said timing reference characteristic detector detects a data type of said timing reference signal, and wherein said ratio adjustment circuit adjusts said rational numeric representation in conformity with said detected data type.

7. The circuit of claim 1, wherein said stable clock is derived from said timing reference signal, whereby said numerically-controlled oscillator generates said clock output without requiring a locally generated clock.

8. The circuit of claim 1, wherein said numerically-controlled oscillator is a direct digital synthesis circuit, comprising: a phase integrator for integrating said rational numeric representation at each period of said stable clock to generate a phase index;
a sinusoid generating circuit for providing a digital representation of said at least one substantially sinusoidal analog signal in response to said phase index;
a conversion circuit for converting said digital representation of said at least one substantially sinusoidal analog signal to said at least one substantially sinusoidal analog signal; and
an analog-to-digital clock conversion circuit for converting an output of said conversion circuit to said clock output.

9. The circuit of claim 1, wherein said numerically-controlled oscillator is a fractional-N oscillator circuit, comprising:
a voltage controlled oscillator for providing said clock output;
a local divider for dividing said clock output in conformity with a divisor input;
a local phase-frequency detector for comparing an output of said local divider with said stable clock;
an analog loop filter for filtering an output of said local phase-frequency detector to provide a control input of said voltage controlled oscillator; and
a delta-sigma modulator having an input coupled to an output of said local phase-frequency detector and an output providing said divisor input of said local divider.

10. A method of providing a clock output synchronized to a timing reference signal supplied to a timing reference input, said method comprising:
generating a clock output from a numerically-controlled oscillator ratiometrically locked to a stable clock source, wherein a frequency of said clock output is controlled by a rational numeric representation of a ratio between a frequency of said clock output and a frequency of said stable clock;
generating a representation of an on-going phase-frequency difference between said timing reference signal and a signal derived from said clock output;
filtering said representation of said on-going phase-frequency difference with a digital filter to provide said rational numeric representation to said numerically-controlled analog oscillator;
detecting a characteristic of said timing reference signal independent of said on-going phase-frequency difference; and
adjusting said rational numeric representation resulting from the filtering of the representation of the on-going phase-frequency difference in conformity with said detected characteristic.

11. The method of claim 10, wherein said detecting detects a frequency range of said timing reference signal, and wherein said adjusting adjusts said rational numeric representation in conformity with said detected frequency range.

12. The method of claim 11, wherein said timing reference signal has a frequency supplied from among a set of frequencies related by factors of two, and wherein said adjusting adjusts said rational numeric representation by shifting bits of said rational numeric representation according to a particular one of said factors of two determined in conformity with a result of said detecting.

13. The method of claim 10, wherein said detecting detects absence of said timing reference signal, and wherein said adjusting selects a fixed ratio as said rational numeric representation in response to said detecting absence.

14. The method of claim 10, wherein said detecting detects absence of said timing reference signal, and further comprising in response to said detecting absence, selecting a local reference clock in place of said timing reference signal as input to said detecting, and wherein adjusting adjusts said rational numeric representation in conformity with a predetermined frequency of said local reference clock.

15. The method of claim 10, wherein said detecting detects a data type of said timing reference signal, and wherein said adjusting adjusts said rational numeric representation in conformity with said detected data type.

16. The method of claim 10, wherein said stable clock is derived from said timing reference signal, whereby said generating a clock output generates said clock output without using a locally generated clock.

17. The method of claim 10, wherein said generating a clock output comprises:
generating a phase from said rational numeric representation by integrating said rational numeric representation in conformity with periods of said stable clock source; and
calculating representations of sinusoidal waveforms from said generated phase to generate a digital representation of said at least one substantially sinusoidal signal.

18. The method of claim 10, wherein said generating a clock output comprises:
dividing said clock output in conformity with a divisor input;
comparing an output of said local divider with said stable clock with a phase/frequency detector;
filtering a result of said comparing to generate a control signal;
adjusting said divisor input in response to a delta-sigma modulation that receives said rational numeric representation; and
generating said clock output with a voltage controlled oscillator from said result of said filtering.

19. A circuit for providing a clock output synchronized to a timing reference signal supplied to a timing reference input, said circuit comprising:
a numerically-controlled oscillator for providing said clock output and having an input for receiving a rational numeric representation of a ratio between a frequency of said clock output and a frequency of a stable clock for controlling said frequency of said clock output;

a digital phase-frequency detector for generating a representation of an on-going phase-frequency difference between said timing reference signal and a signal derived from said clock output;

a digital loop filter for filtering said representation of said on-going phase-frequency difference to provide said rational numeric representation to said numerically-controlled oscillator;

a timing reference characteristic detection circuit for detecting a frequency range of said timing reference signal; and a ratio adjustment circuit for adjusting said rational numeric representation resulting from the filtering of the representation of the on-going phase-frequency difference in conformity with said detected frequency range.

20. A circuit for providing a clock output synchronized to a timing reference signal supplied to a timing reference input, said circuit comprising:

a numerically-controlled oscillator for providing said clock output and having an input for receiving a rational numeric representation of a ratio between a frequency of said clock output and a frequency of a stable clock for controlling said frequency of said clock output;

a digital phase-frequency detector for generating a representation of an on-going phase-frequency difference between said timing reference signal and a signal derived from said clock output;

a digital loop filter for filtering said representation of said on-going phase-frequency difference to provide said rational numeric representation to said numerically-controlled oscillator;

a detection circuit for detecting absence of said timing reference signal at said timing reference input; and a selector for selecting an alternative source of timing reference in response to said detection circuit detecting said absence.

21. The circuit of claim 20, wherein said selector selects between said timing reference input and a local reference clock signal for application to said phase-frequency detector.

22. The circuit of claim 20, wherein said selector selects between an output of said digital loop filter and a fixed ratio representation to supply said rational numerical representation to said numerically controlled oscillator.

\* \* \* \* \*